(12) United States Patent
Watanabe et al.

(10) Patent No.: US 7,879,397 B2
(45) Date of Patent: Feb. 1, 2011

(54) METHOD FOR PROCESSING POLYSILAZANE FILM

(75) Inventors: Masahisa Watanabe, Nirasaki (JP); Tetsuya Shibata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 545 days.

(21) Appl. No.: 11/987,134

(22) Filed: Nov. 27, 2007

(65) Prior Publication Data

US 2008/0139001 A1 Jun. 12, 2008

(30) Foreign Application Priority Data

Nov. 30, 2006 (JP) ............... 2006-324325

(51) Int. Cl.
*C23C 16/00* (2006.01)
*B05D 3/00* (2006.01)
*B05D 3/02* (2006.01)
*B05D 3/04* (2006.01)

(52) U.S. Cl. ............... 427/248.1; 427/331; 427/372.2; 427/377; 427/397.7

(58) Field of Classification Search ............... 427/248.1, 427/331, 372.2, 377, 397.7
See application file for complete search history.

(56) References Cited

U.S. PATENT DOCUMENTS

2006/0246684 A1* 11/2006 Hoshi et al. ............... 438/427

FOREIGN PATENT DOCUMENTS

JP 2005-116706 4/2005
JP 2005116706 A * 4/2005

OTHER PUBLICATIONS

Chinese Office Action issued Jun. 28, 2010 for priority Chinese Application No. 200710196360.3 w/English language translation.

* cited by examiner

*Primary Examiner*—Timothy H Meeks
*Assistant Examiner*—Kelly M Gambetta
(74) *Attorney, Agent, or Firm*—Smith, Gambrell & Russell, LLP

(57) ABSTRACT

A method for processing a polysilazane film includes performing temperature increase of changing a process field of a reaction container, which accommodates a target substrate with a polysilazane coating film formed thereon, from a preheating temperature to a predetermined temperature, while setting the process field to be a first atmosphere containing oxygen and having a first pressure of 6.7 to 26.7 kPa. Then, the method includes performing a first heat process for obtaining an insulating film containing silicon and oxygen by baking the coating film at a first process temperature not lower than the predetermined temperature, while setting the process field to be a second atmosphere containing an oxidizing gas and having a second pressure higher than the first pressure.

10 Claims, 6 Drawing Sheets

METHOD FOR PROCESSING POLYSILAZANE FILM

BACKGROUND OF THE INVENTION

1. Field of the Invention

The present invention relates to a method for processing a polysilazane film disposed on a target substrate, such as a silicon wafer, and particularly to a method preferably applied to a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In general, a silicon oxide film ($SiO_2$ film) is used as an insulating film, such as the device isolation film of an STI (Shallow Trench Isolation) structure or the inter-level insulating film of a PMD (Pre-Metal Dielectric) structure, for semiconductor devices. As a method for forming a silicon oxide film of this kind, a process for forming an insulating film by CVD (Chemical Vapor Deposition), such as a BPSG (Boron Phospho-Silicate Glass) method or ozone TEOS (TetraEthyl Ortho-Silicate) method, is used, in general.

In recent years, semiconductor devices have become smaller with an increase in integration degree (for example, semiconductor devices of a generation having a line width of less than 0.13 µm), thereby increasing the aspect ratio of trenches for STI and recesses, e.g., gaps between members thereof. Where a method, such as the BPSG method or ozone TEOS method described above, is used to form an $SiO_2$ film to fill a recess having a high aspect ratio, a problem arises such that the $SiO_2$ film is very poor in filling the recess (step coverage).

In order to improve the step coverage for a recess having a high aspect ratio, researches have been conducted to use a polysilazane (—(SiR1-NR2)n-: R1 and R2 represent alkyl groups) film as a device isolation film or inter-level insulating film. Where a polysilazane film is formed, a polysilazane coating solution is applied onto a target substrate, and is then subjected to a heat process, so that it is baked into an insulating film containing silicon and oxygen (typically, a silicon oxide film ($SiO_2$ film)). Silicon oxide films of this coating type excel in step coverage, and have an advantage in that they can become dense by a heat process performed within a water vapor atmosphere, so that they do not have voids or seams formed therein.

BRIEF SUMMARY OF THE INVENTION

An object of the present invention is to provide a method for processing a polysilazane film, which can effectively prevent particle generation, when performing a heat process on a target substrate with a polysilazane coating film formed thereon.

According to a first aspect of the present invention, there is provided a method for processing a polysilazane film, the method comprising: loading a target substrate with a polysilazane coating film formed thereon into a process field inside a reaction container; then, performing temperature increase of changing the process field from a pre-heating temperature to a predetermined temperature, while setting the process field to be a first atmosphere containing oxygen and having a first pressure of 6.7 to 26.7 kPa; and then, performing a first heat process for obtaining an insulating film containing silicon and oxygen by baking the coating film at a first process temperature not lower than the predetermined temperature, while setting the process field to be a second atmosphere containing an oxidizing gas and having a second pressure higher than the first pressure.

According to a second aspect of the present invention, there is provided a method for processing a polysilazane film, the method comprising: loading a target substrate with a polysilazane coating film formed thereon into a process field inside a reaction container; then, performing temperature increase of changing the process field from a pre-heating temperature to a predetermined temperature at an average temperature increase rate of 1 to 10° C./minute, while setting the process field to be a first atmosphere containing oxygen and having a first pressure; and then, performing a first heat process for obtaining an insulating film containing silicon and oxygen by baking the coating film at a first process temperature not lower than the predetermined temperature, while setting the process field to be a second atmosphere containing an oxidizing gas and having a second pressure higher than the first pressure.

According to a third aspect of the present invention, there is provided a method for processing a polysilazane film, the method comprising: loading a target substrate with a polysilazane coating film formed thereon into a process field inside a reaction container; then, exhausting gas from inside the reaction container, while setting the process field to be a preliminary atmosphere containing oxygen and having a preliminary pressure of 0.1 to 1.3 kPa; then, performing temperature increase of changing the process field from a pre-heating temperature to a predetermined temperature, while setting the process field to be a first atmosphere containing oxygen and having a first pressure; and then, performing a first heat process for obtaining an insulating film containing silicon and oxygen by baking the coating film at a first process temperature not lower than the predetermined temperature, while setting the process field to be a second atmosphere containing an oxidizing gas and having a second pressure higher than the first pressure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
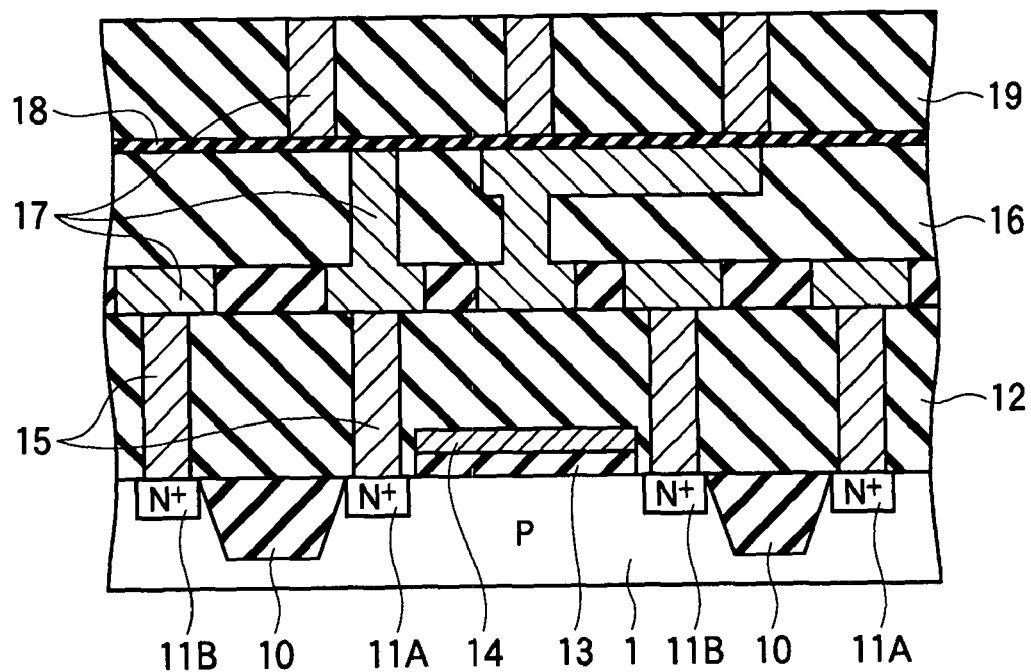
FIG. 1 is a sectional view showing the structure of a semiconductor device including a polysilazane film.

In the process of developing the present invention, the inventors studied problems with regard to heat processes for polysilazane films. As a result, the inventors have arrived at the findings given below.

Specifically, a process for baking a polysilazane coating film to transform it into a silicon oxide film or the like is performed in a so-called batch furnace, such as a vertical heat processing apparatus. According to this apparatus, a holder that supports a number of wafers is loaded into a reaction tube (reaction container). Then, while the atmosphere inside the reaction tube is sequentially switched between a water vapor atmosphere, a nitrogen atmosphere, and so forth, a heat process is performed on the wafers in accordance with predetermined temperature increase steps. With this heat process, impurities, such as nitrogen, carbon, and hydrogen, are removed from the polysilazane coating film, and the basic bone structure of the coating film is transformed into $SiO_2$, thereby forming an insulating film.

In the sequential steps of the heat process for baking the polysilazane coating film, the interior of the reaction tube is first set at a pre-heating temperature of, e.g., 200° C. lower than the baking process temperature, so that the time necessary for increasing temperature to the process temperature is shortened to improve the throughput. On the other hand, when the coating film is formed on each wafer, a polysilazane coating solution using a solvent is applied to the wafer, and then is subjected to a baking process to evaporate the solvent. However, a small amount of solvent still remains in the coating film, and is evaporated form the coating film into the reaction tube when the coating film is exposed to a high temperature atmosphere. Further, polysilazane has molecular weight distribution, and part of polysilazane having a low molecular weight is sublimated as a gas emission when the coating film is exposed to a high temperature atmosphere.

Consequently, when the polysilazane coating film is exposed to the pre-heating temperature atmosphere, or is heated up from the pre-heating temperature to the process temperature, evaporated gases of the solvent and/or polysilazane having a low molecular weight are emitted (which will be collectively referred to as an out gas, hereinafter). This out gas contains silane, hydrogen, ammonia, and so forth. These components of the out gas react with each other inside the reaction tube and generate particles, which are then deposited on the wafer surface as contaminants.

In light of this problem, the research group including the present inventors developed a technique such that a wafer with a polysilazane coating film formed thereon is loaded into an oxygen atmosphere formed in advance inside a pre-heated reaction tube (Jpn. Pat. Appln. KOKAI Publication No. 2005-116706 (claim 8, paragraphs 0091 to 0094, and FIG. 15): Patent Document 1). Within the oxygen atmosphere, a reaction is promoted to transform the bone structure of part of the polysilazane having a low molecular weight into $SiO_2$, so that sublimation of the polysilazane is prevented, thereby suppressing the out gas emission and particle generation.

According to an experiment in a heat process for baking a coating film applied on 100 wafers of 200 mm, the number of particles (0.16 μm or more) deposited on wafers was deceased to 20/wafer or less by the technique disclosed in Patent Document 1. However, nowadays, in order to improve the process efficiency, it is sometimes required to process 100 wafers of 300 mm or 200 wafers of 200 mm. In the case of such processes with heavier load, the amount of polysilazane applied on wafers is increased, and the total amount of generated out gas is thereby increased. In this case, it may be difficult for the technique disclosed in Patent Document 1 to sufficiently suppress an increase in particle deposition, which brings about a decrease in process yield.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a sectional view showing the structure of a semiconductor device including a polysilazane film. In FIG. 1, there is a semiconductor substrate 1 formed of, e.g., a P-type silicon (Si) substrate. The surface of the semiconductor substrate 1 is provided with $N^+$-type source layers 11A and $N^+$-type drain layers 11B formed therein, and device isolation films 10 each filling a recess to form an STI structure. A gate oxide film 13 formed of, e.g., a silicon oxide film, and a gate electrode 14 formed of, e.g., a poly-silicon film are disposed on the semiconductor substrate 1 in this order. The gate oxide film 13 and gate electrode 14 are covered with a first inter-level insulating film 12 disposed on the semiconductor substrate 1.

Metal wiring layers 17 made of, e.g., Cu (copper) or Al (aluminum) are disposed (copper is used in FIG. 1) on the first inter-level insulating film 12. The $N^+$-type source layers 11A and $N^+$-type drain layers 11B are connected to the Cu wiring layers 17 through plug layers 15 made of W (tungsten). A second inter-level insulating film 16 is disposed on the first inter-level insulating film 12. A third inter-level insulating film 19 is disposed on the second inter-level insulating film 16 with a hard mask 18 formed of, e.g., a nitride film, interposed therebetween. In the semiconductor device having this multi-layered structure, the device isolation film 10 and first inter-level insulating film are formed of insulating films obtained by baking a polysilazane film.

Figure 2:
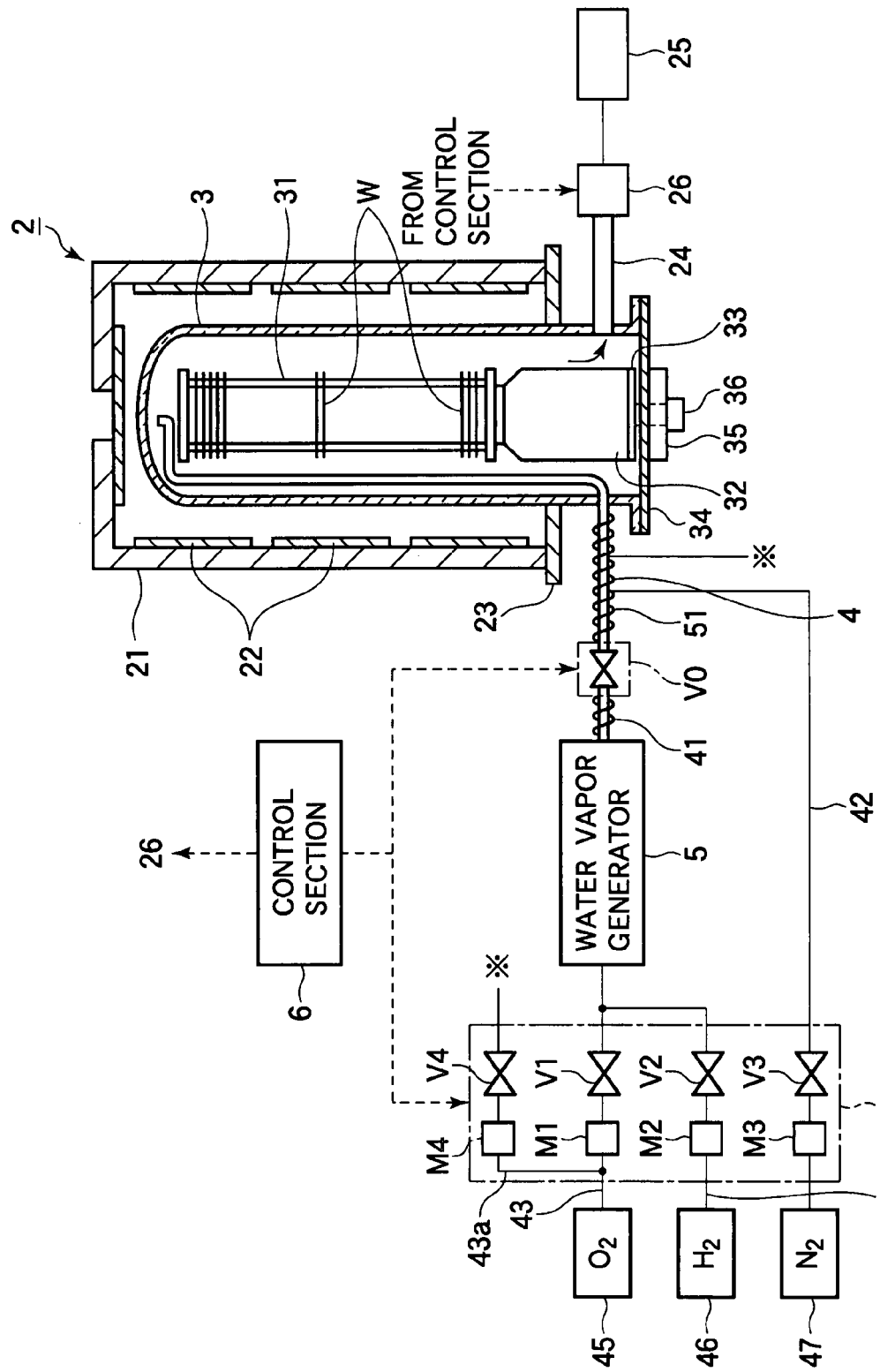
FIG. 2 is a structural view showing a vertical heat processing apparatus according to an embodiment of the present invention.

FIG. 2 is a structural view showing a vertical heat processing apparatus according to an embodiment of the present invention. As shown in FIG. 2, this apparatus includes a vertical heating furnace 2 fixed to a base body 23 at the bottom. The heating furnace 2 is formed of, e.g., a cylindrical insulating body 21, which is provided with a ceiling and heating means disposed inside. For example, the heating means is formed of heaters 22 of the resistance heating type, which are disposed circumferentially along the inner wall-surface of the insulating body 21. The process field (heat-processing atmosphere area) is divided into a plurality of zones in the vertical direction, and the heaters 22 are respectively disposed at the zones, so that the zones can be controlled in heating independently of each other. A reaction tube (reaction container or process chamber) 3 made of, e.g., quartz is disposed inside the heating furnace 2. The reaction tube 3 has a vertical structure with a closed top, in which the process field is defined. The reaction tube 3 is fixed to the base body 23, while a portion thereof near the bottom is surrounded by the base body 23.

This vertical heat processing apparatus also includes a wafer boat 31 or holder to hold a plurality of, e.g., 100, target substrates, such as semiconductor wafers W, in a state where they are stacked at intervals. The wafer boat 31 is placed on a lid 34 through a heat insulator or insulating cylinder 32 and a turntable 33. The lid 34 is attached to a boat elevator 35, and is used to open and close a port at the bottom of the reaction tube 3. The boat elevator 35 is provided with a rotation mechanism 36 to rotate the turntable 33 along with the wafer boat 31. The boat elevator 35 is moved up and down, so that the wafer boat 3 is loaded and unloaded into and from the reaction tube 3.

A gas supply pipe 4 extending from a gas supply system 40 is inserted into the bottom of the reaction tube 3 from the outside. For example, the gas supply pipe 4 extends vertically upward in the reaction tube 3 and is bent at the distal end to spout a process gas toward the ceiling of the reaction tube 3 near the center thereof. On the other hand, as shown in FIG. 2, the upstream side of the gas supply pipe 4 is bifurcated into a first gas supply pipe 41 and a second gas supply pipe 42.

The first gas supply pipe 41 is provided with a water vapor generator 5 used as water vapor generating means. The first gas supply pipe 41 is further divided into an oxygen gas supply pipe 43 and a hydrogen gas supply pipe 44 at an upstream position from the water vapor generator 5. The proximal side of the oxygen gas supply pipe 43 is connected to an oxygen gas supply source 45 through a valve V1 and a mass-flow controller M1. The proximal side of the hydrogen gas supply pipe 44 is connected to a hydrogen gas supply source 46 through a valve V2 and a mass-flow controller M2.

A bypass line 43*a* for bypassing the water vapor generator 5 is connected to the oxygen gas supply pipe 43 at an upstream position from the mass-flow controller M1. The bypass line 43*a* is directly connected to the gas supply pipe 4 through a mass-flow controller M4 and a valve V4 to directly supply oxygen into the reaction tube 3. The proximal side of the second gas supply pipe 42 is connected to a nitrogen gas supply source 47 through a valve V3 and a mass-flow controller M3. The mass-flow controllers M1 to M4 and valves V1 to V4 constitute part of the gas supply system 40 for adjusting the flow rates of supplied gases.

The first gas supply pipe 41 is provided with a valve V0 at a downstream position from the water vapor generator 5. The downstream portions of the gas supply pipes 4 and 41 are provided with a heater or heating means, such as a wrapping tape heater 51, to heat them to prevent water vapor from condensing. The water vapor generator 5 has heating means for heating a gas passing therethrough. A catalyst, such as platinum, is disposed in the gas passage of the water vapor generator 5. In the water vapor generator 5, oxygen gas and hydrogen gas are heated to a predetermined temperature of, e.g., 500° C. or less, and come into contact with the catalyst. Consequently, in the presence of the catalyst, oxygen gas and hydrogen gas react with each other and generate water vapor. The water vapor generator 5 can set the concentration of water vapor to be about 1% to 90% in the mixture of water vapor and oxygen gas within the reaction tube 3 set at a vacuum pressure.

The bottom of the reaction tube 3 is connected through an exhaust pipe 24 to a vacuum pump 25 used as pressure-reducing means. The exhaust pipe 24 is provided with pressure regulator 26. In this embodiment, the pressure regulator 26 includes a main valve for opening and closing the exhaust pipe 24, as well as a device for adjusting pressure, such as a butterfly valve.

Further, the vertical heat processing apparatus includes a control section 6, such as a computer. The control section 6 is arranged to control the heater 22, gas supply system 40, and pressure regulator 26. For example, this control includes control on the temperature and pressure inside the reaction tube 3, control on the flow rates of oxygen gas and water vapor, and so forth. The control section 6 reads out a program from a storage medium (not shown), which stores programs for executing process sequences with process parameters, and operates the respective components to realize the program. The storage medium is formed of storage means, such as a hard disk, compact disk, magnetic optical disk, and/or memory card.

Figure 3:
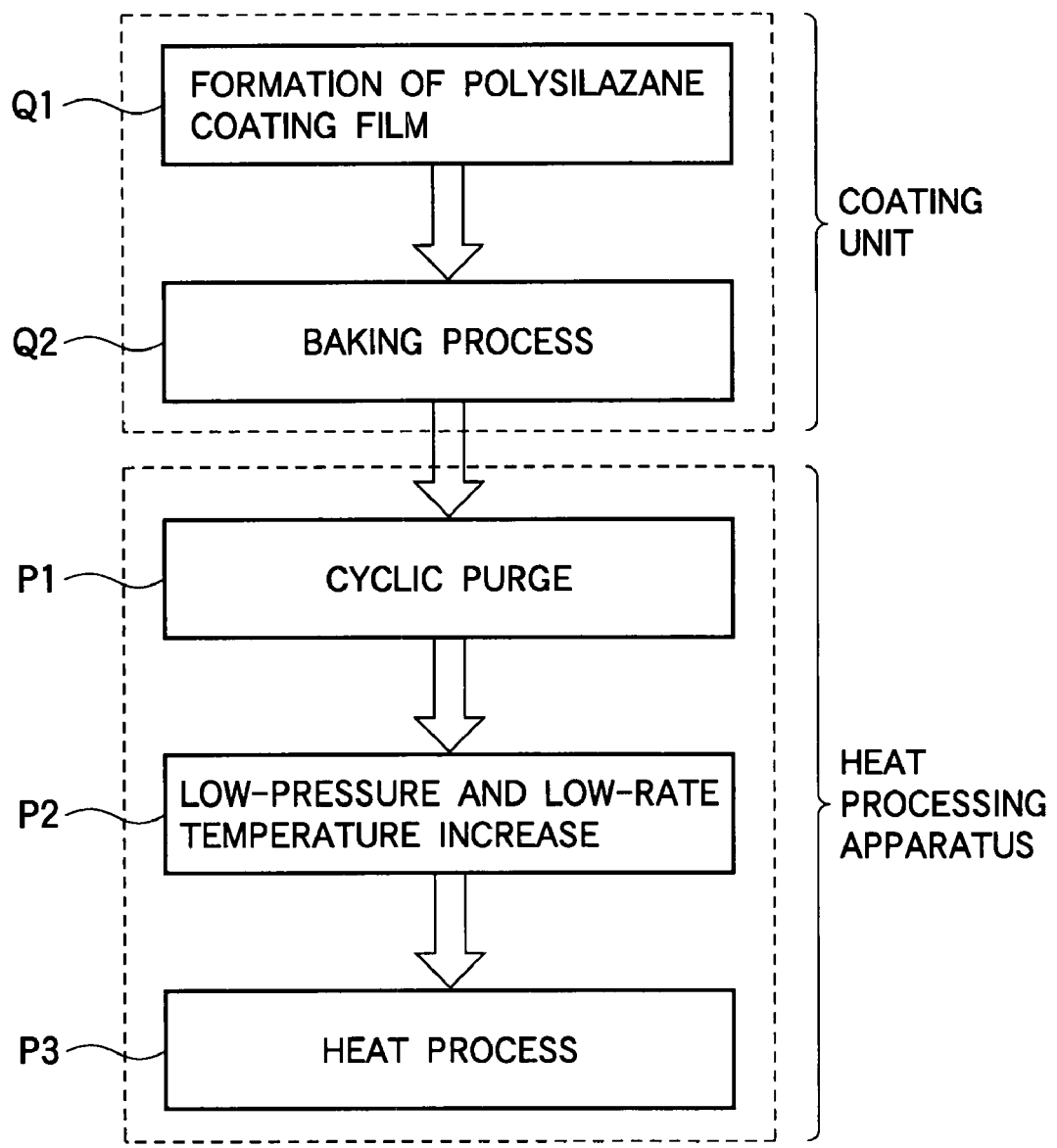
FIG. 3 is a flowchart for explaining a method for processing a polysilazane film according to an embodiment of the present invention.
Figure 4:
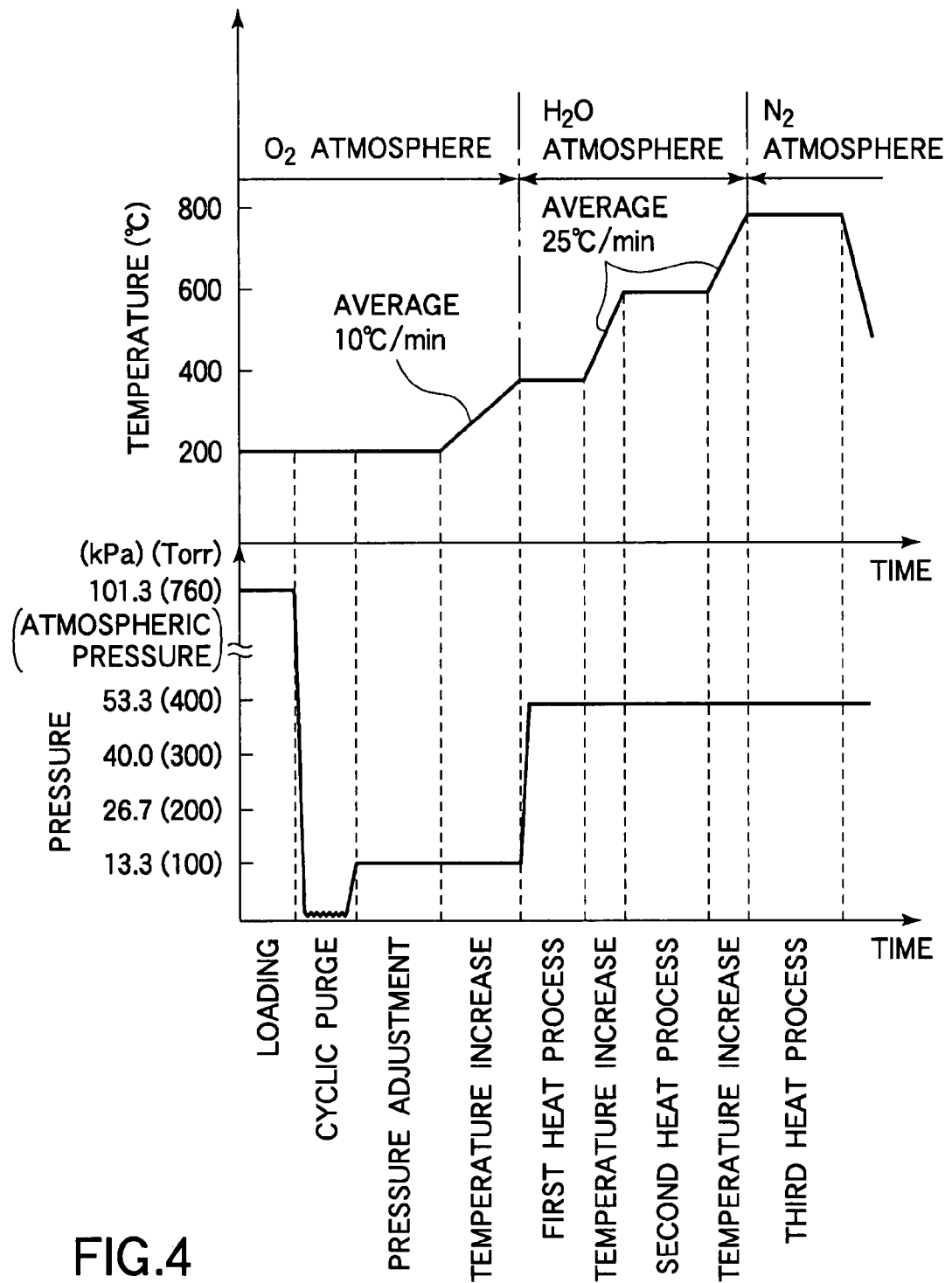
FIG. 4 is a diagram showing the temperature and the state inside a reaction tube (reaction container), in the steps of the processing method shown in FIG. 3.

Next, with reference to FIGS. 3 and 4, an explanation will be given of a method for processing a polysilazane film, performed in the apparatus shown in FIG. 2. In this embodiment, the polysilazane film is used as a device isolation film 10 or a first inter-level insulating film 12 disposed below metal wiring in a semiconductor device, as shown in FIG. 1. FIG. 3 is a flowchart for explaining a method for processing a polysilazane film according to an embodiment of the present invention. FIG. 4 is a diagram showing the temperature and the state inside a reaction container, in the steps of the processing method shown in FIG. 3.

In this embodiment, as shown in FIG. 3, a preceding step for forming a polysilazane coating film is performed in a coating unit (not shown). Then, baking of the coating film is performed in the vertical heat processing apparatus shown in FIG. 2. In the coating unit, each wafer W is provided with a coating solution on the surface, which contains a polysilazane (—(SiR1-NR2)n-: R1 and R2 represent alkyl groups) component and a solvent, and is applied thereon by, e.g., a spin coating method (process Q1). Then, for example, the coating film thus formed is subjected to a baking process at a temperature of about 150° C. for 3 minutes to remove the solvent in the coating solution (process Q2). Then, wafers W each provided with such a coating film are transferred by wafer carriers (not shown) to the vertical heat processing apparatus shown in FIG. 2.

When wafers W are loaded into the vertical heat processing apparatus, the interior of the reaction tube 3 is set at a pre-heating temperature of, e.g., 200° C., which is lower than a process temperature described later. Further, the interior of the reaction tube 3 is purged with oxygen gas by opening the valve V4 of the bypass line 43*a* without bringing the water vapor generator 5 in operation. Along with this state, for example, 100 wafers W are transferred by a wafer transfer unit (not shown) from the wafer carriers onto the wafer boat 31 placed in a loading area below the reaction tube 3. After the transfer of the wafers W is completed, the wafer boat 31 is moved up and loaded into the reaction tube 3. The port at the bottom of the reaction tube 3 is closed by the lid 34.

When the wafers W are loaded into the reaction tube 3, the wafers W with a coating film formed thereon are rapidly heated from the temperature of the loading area, such as about room temperature, to the pre-heating temperature of, e.g., 200° C. Consequently, part of the solvent that has not been removed by the baking process and part of polysilazane having a low molecular weight are emitted as an out gas form the coating film. In light of this problem, this embodiment is arranged to perform cyclic purge (process P1) and low-pressure and low-rate temperature increase (process P2) before a heat process (process P3), as shown in FIG. 3, so as to suppress particle generation due to the out gas emission. These processes will be explained below.

After the reaction tube 3 is airtightly closed by the lid 34, as described above, the interior of the reaction tube 3 is vacuum-exhausted by the vacuum pump 25 through the exhaust pipe 24. At this time, as shown in FIG. 4, while the pre-heating temperature is kept constant, the set value of the pressure regulator 26 is periodically swung within a range of, e.g., 0.1 to 1.3 kPa (1 to 10 torr) in a manner of, e.g., "0.1 kPa→1.3 kPa→0.1 kPa→ ---". At the same time, the set value of the mass-flow controller M4 is also periodically swung within a range of, e.g., 1 to 10 slm in a manner of, e.g., "1 slm→10 slm→1 slm→ ---". By doing so, cyclic purge of swinging the pressure inside the reaction tube 3 and the oxygen gas flow rate is performed for, e.g., 5 to 30 minutes (process P1). During this cyclic purge, the atmosphere inside the reaction tube 3 is agitated by fluctuations in the oxygen gas flow rate and pressure, so that gas inside the reaction tube 3 is efficiently purged out of the reaction tube 3 while preventing gas stagnant. The cyclic purge inside the reaction tube 3 is performed immediately after loading of the wafers W to forcibly exhaust, from inside the reaction tube 3, the out gas suddenly emitted from the coating film due to the rapid temperature change from room temperature to the pre-heating temperature. Consequently, particle generation is suppressed immediately after the loading step.

After the cyclic purge is finished, while the pre-heating temperature is kept constant, as shown in FIG. 4, the set value of the mass-flow controller M4 is adjusted to, e.g., 10 slm to make the oxygen gas flow rate constant. Further, the set value of the pressure regulator 26 is adjusted to a value within a range of 6.7 to 26.7 kPa (50 to 200 torr), such as 13.3 kPa (100 torr), to make the pressure inside the reaction tube 3 constant.

After the adjustment of the pressure inside the reaction tube 3 is finished, the oxygen flow rate and the pressure inside the reaction tube 3 are maintained for, e.g., 15 minutes to sufficiently evaporate the solvent in the coating film, and then temperature increase is started for the interior of the reaction tube 3. In this temperature increase process, the heater 22 is controlled to heat the process field inside the reaction tube 3 to a predetermined temperature, such as 400° C. for performing a heat process (first heat process described later), at an average temperature increase rate of 1 to 10° C./minute, such as 10° C./minute. The pre-heating temperature is set to be 100 to 200° C., while the predetermined temperature is set to be 200 to 500° C.

Also in this temperature increase period, the coating film receives an effect of the temperature change, and an out gas is emitted from the wafers W. Accordingly, during this period, while the vacuum-exhaust of the reaction tube 3 and supply of oxygen gas are kept performed, the pressure inside the reaction tube 3 is set to be lower (low pressure temperature increase) than the pressure of the heat process, and the temperature increase rate to the process temperature is set at a low value (low rate temperature increase). This low-pressure and low-rate temperature increase (process P2) suppresses particle generation due to the out gas.

In the process P2, oxygen gas is supplied to transform the bone structure of part of the polysilazane having a low molecular weight into an SiO$_2$ bone structure. Further, while emission of an out gas is suppressed, an emitted out gas is exhausted, so that particle generation is suppressed inside the reaction tube 3. In order to realize the low pressure temperature increase in the process P2, the pressure of the process field is set to be 6.7 to 26.7 kPa (50 to 200 torr), which is higher than the pressure of the cyclic purge, i.e., 0.1 to 1.3 kPa (1 to 10 torr). If the pressure is lower than this range, even oxygen gas is exhausted, so oxygen cannot be sufficiently supplied to polysilazane. In this case, the amount of sublimated gas from the polysilazane film may become larger, resulting in an increase in particle generation. On the other hand, if the pressure is higher than this range, exhaust of the out gas may become insufficient, resulting in an increase in particle generation.

Further, in the process P2, the temperature increase rate is set at a low value to decrease the amount of out gas emission from the wafers W per unit of time. Consequently, a reaction of oxygen with part of the polysilazane having a low molecular weight is performed for a sufficient time. In order to realize the low rate temperature increase in the process P2, the temperature increase rate of the process field is set to be 1 to 10° C./minute. If the temperature increase rate is higher than this range, the effect of suppressing particle generation may become insufficient. On the other hand, if the temperature increase rate is lower than this range, the process efficiency may be deteriorated too much due a decrease in throughput.

After the temperature increase to 400° C. is finished by the processes P1 and P2, a heat process for baking the coating film is started (process P3). As shown in FIG. 4, for example, this heat process contains first, second, and third heat processes. The first heat process is arranged to form the bone structure of the polysilazane film. The second heat process is arranged to remove alcohol components to improve the physical strength of the polysilazane film. The third heat process is arranged to densify the polysilazane film. These heat processes will be briefly explained. Since the cyclic purge and the low-pressure and low-rate temperature increase are performed in advance, the solvent and part of the polysilazane having a low molecular weight in the coating film have been removed from inside the reaction tube 3, and the bone structure of the coating film has been transformed into SiO$_2$ by oxygen gas. However, in the first heat process, since an out gas is generated from the coating film to some extent, the interior of the reaction tube 3 should be kept exhausted to set a vacuum atmosphere. On the other hand, in the second and third heat processes, particle generation due to an out gas can be hardly caused.

The first heat process is performed subsequently to the low-pressure and low-rate temperature increase. Specifically, the interior of the reaction tube 3 is switched from the oxygen gas atmosphere into a water vapor atmosphere (oxidizing gas atmosphere) at a temperature, such as 400° C., not lower than the predetermined temperature described in the temperature increase. For this switching, oxygen gas and hydrogen gas are supplied into water vapor generator 5, so that water vapor thereby generated is supplied into the reaction tube 3. At this time, the valve V4 of the bypass line 43a is set closed and the valves V1, V2, and V0 are set opened. Further, the pressure regulator 26 is controlled to adjust the pressure inside the reaction tube 3 to a value of higher than that of the process P2 and lower than 101 kPa, such as 53.3 kPa (400 torr), so that the process field having a vacuum atmosphere is set to have a moisture concentration of, e.g., 80%. The first heat process is performed for, e.g., 30 minutes, while these conditions are maintained, so that impurities, such as nitrogen, carbon, and hydrogen, are removed, and an SiO$_2$ bone structure is formed, thereby providing the polysilazane film with an insulating property.

As described below, since the temperature is gradually increased during the first to third heat processes, this temperature range can be expressed by a range of, e.g., 200 to 1000° C. For the sake of simplicity of explanation, the baked film is also referred to as a polysilazane film.

Thereafter, while the pressure and supply of water vapor are maintained (oxidizing gas atmosphere), the heater 22 is controlled to heat up the interior of the reaction tube 3 to a temperature of, e.g., 600° C. at a average temperature increase rate of, e.g., 25° C./minute. The second heat process is performed for, e.g., 30 minutes, while these conditions are maintained, so that components derived from OH groups, such as alcohol, contained in the polysilazane film are removed to improve the physical strength of the polysilazane film.

Thereafter, the valves V0 to V2 are closed to stop the supply of water vapor. Further, the valve V3 is opened to supply nitrogen gas, thereby replacing the atmosphere inside the reaction tube 3 with a nitrogen gas atmosphere (inactive gas atmosphere). Then, while the pressure is maintained, the heater 22 is controlled to heat up the interior of the reaction tube 3 to a temperature of, e.g., 800° C. at an average temperature increase rate of, e.g., 25° C./minute. The third heat process is performed for, e.g., 30 minutes, while these conditions are maintained, so that the polysilazane film is densified.

Thereafter, the temperature inside the reaction tube 3 is decreased to, e.g., 400° C., and the interior of the reaction tube 3 is returned to atmospheric pressure by purging with nitrogen gas. Then, the wafer boat 31 is unloaded, and the wafers W are taken out by the transfer unit, with a transfer operation reverse to that described above in relation to loading. The temperatures, pressure conditions, and gas atmospheres used in the heat processes are suitably set in accordance with the structure of semiconductor devices to be manufactured and so forth.

This embodiment can provide the following effects. Specifically, the polysilazane film disposed on the wafers W is baked to form an insulating polysilazane film (an insulating film containing silicon and oxygen). In this process, when the temperature inside the reaction tube 3 is increased from the pre-heating temperature to a predetermined temperature in the course of heating to the process temperature, an oxygen gas atmosphere is formed at a low pressure. In this case, while generation of sublimated gas from the coating film is suppressed by oxygen, a generated out gas is exhausted. Consequently, it is possible to enhance the effect of suppressing particle generation due to an out gas.

When the temperature inside the reaction tube 3 is increased from the pre-heating temperature to a predetermined temperature in the course of heating to the heat process temperature, the average temperature increase rate is set to be within a range of 1 to 10° C. /minute. Consequently, the amount of out gas emission from the wafers W per unit of time is decreased, and a reaction of oxygen with part of the polysilazane having a low molecular weight is performed for a sufficient time. Consequently, the amount of out gas sublimated without a reaction with oxygen is decreased, and particle generation is thereby suppressed.

After the wafers W are loaded into the reaction tube 3 set at the pre-heating temperature, the cyclic purge inside the reaction tube 3 is performed while the pressure and the flow rate of oxygen gas are swung. Consequently, an out gas emitted due to a rapid temperature change from room temperature to the pre-heating temperature is efficiently exhausted.

In the conventional method arranged to simply perform temperature increase while supplying oxygen gas into the reaction tube 3, it is difficult to decrease particles in a heat process for treating wafers W having a larger diameter or a large number of wafers W, such as 200 or more wafers. On the other hand, with the low pressure temperature increase, low rate temperature increase, and cyclic purge according to this embodiment, it is possible to decrease particles even in a heat process for treating such wafers W, thereby improving the baking process efficiency.

The three techniques described above (low pressure temperature increase, low rate temperature increase, and cyclic purge) respectively have their own effects of suppressing particle generation. Accordingly, these three techniques can be applied to a vertical heat processing apparatus such that they are applied together as in the embodiment, or one of them or two of them are selectively applied, as needed.

Experiment 1

An experiment was conducted in terms of the relationship between the pressure inside the reaction tube during temperature increase and the particle deposition on wafers. In this experiment, 100 wafers W with a coating film formed thereon were loaded into the process field inside the reaction tube 3. Then, an oxygen gas atmosphere was formed inside the process field while it was kept exhausted, and was heated from 200° C. to 400° C. at a temperature increase rate of 25° C. /minute. The pressure of the process field was set at different values (used as a parameter). Some of the wafers W thus processed were sampled, and the number of particles deposited thereon and having a size of 0.12 μm or more was measured. The particle deposition was measured by an optical wafer particle counter. In the experiment 1, three or four runs were performed under each set of conditions, and an average value of particle deposition obtained by the runs was calculated as an experimental result of each of the present examples and comparative examples.

PRESENT EXAMPLE PE1-1

The pressure inside the reaction tube 3 was set at 6.7 kPa (50 torr).

PRESENT EXAMPLE PE1-2

This example differed from the present example PE1-1 only in that the pressure inside the reaction tube 3 was set at 13.3 kPa (100 torr).

PRESENT EXAMPLE PE1-3

This example differed from the present example PE1-1 only in that the pressure inside the reaction tube 3 was set at 26.7 kPa (200 torr).

Comparative Example CE1-1

This example differed from the present example PE1-1 only in that the pressure inside the reaction tube 3 was set to be 0.1 kPa (1 torr) or less by full load exhaust with the valve or pressure regulator 26 fully opened.

Comparative Example CE1-2

This example differed from the present example PE1-1 only in that the pressure inside the reaction tube 3 was set at 53.3 kPa (400 torr).

Figure 5:
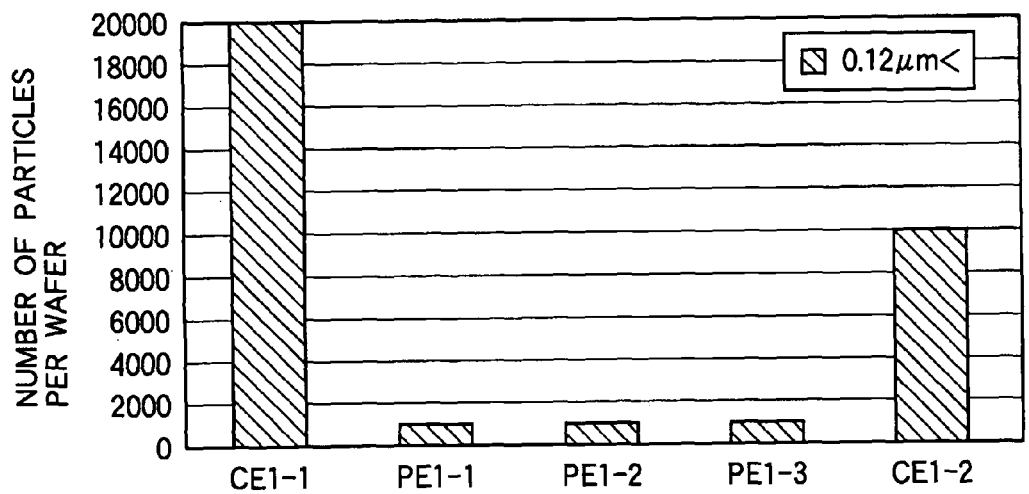
FIG. 5 is a characteristic diagram showing the relationship between the pressure inside the reaction tube during temperature increase and the particle deposition on wafers.

FIG. 5 is a characteristic diagram showing the relationship between the pressure inside a reaction tube during temperature increase and the particle deposition on wafers, obtained by the experiment 1. The bar graph of FIG. 5 shows the average number of particles deposited on the sample wafers W of the 100 wafers W processed in the reaction tube 3. Each of the bars shows the number of particles having a diameter of 0.12 µm or more.

As shown in FIG. 5, in the present examples PE1-1 to PE1-3, the number of deposited particles having a diameter of 0.12 µm or more was about 1,000. In the comparative example CE1-1, the number of deposited particles exceeded the upper limit of the measurement range of the particle counter. In the comparative example CE1-2, the number of deposited particles having a diameter of 0.12 µm or more was about 10,000, which was about ten times larger than those of the present examples.

The result of the comparative example CE1-1 is thought to have been caused by the following phenomenon. Specifically, in this case, since the interior of the reaction tube 3 was exhausted at full load, almost all the oxygen gas supplied therein was exhausted out of the reaction tube 3. Consequently, a reaction of oxygen gas with part of polysilazane having a low molecular weight was not promoted on the surface of the wafers W. It followed that the out gas emission was not suppressed, so the number of particles generated by the out gas was not decreased. On the other hand, the result of the comparative example CE1-2 is thought to have been caused by the following phenomenon. Specifically, in this case, since the pressure inside the reaction tube 3 was maintained at a relatively high value, an out gas emitted inside the reaction tube 3 was not sufficiently exhausted, so the particle deposition was increased.

Experiment 2

An experiment was conducted in terms of the relationship between the temperature increase rate and the particle deposition on wafers. In this experiment, 100 wafers W with a coating film formed thereon were loaded into the process field inside the reaction tube 3. Then, an oxygen gas atmosphere was formed inside the process field at a pressure of 13.3 kPa (100 torr) while it was kept exhausted, and was heated from 200° C. to 400° C. The temperature increase rate of the process field was set at different values (used as a parameter). Some of the wafers W thus processed were sampled, and the number of particles deposited thereon and having a size of 0.12 µm or more was measured. As regards the sample wafers, four wafers were respectively selected from four positions at the upper most level, an upper middle level, a lower middle level, and the lower most level. An average value of particle deposition was calculated from the number of particles deposited on the sample wafers. In the experiment 2, three or four runs were performed under each set of conditions, and an average value of particle deposition obtained by the runs was calculated as an experimental result of each of the present examples.

PRESENT EXAMPLE PE2-1

The temperature increase rate was set at 1° C./minute.

PRESENT EXAMPLE PE2-2

This example differed from the present example PE2-1 only in that the temperature increase rate was set at 10° C./minute.

Figure 6:
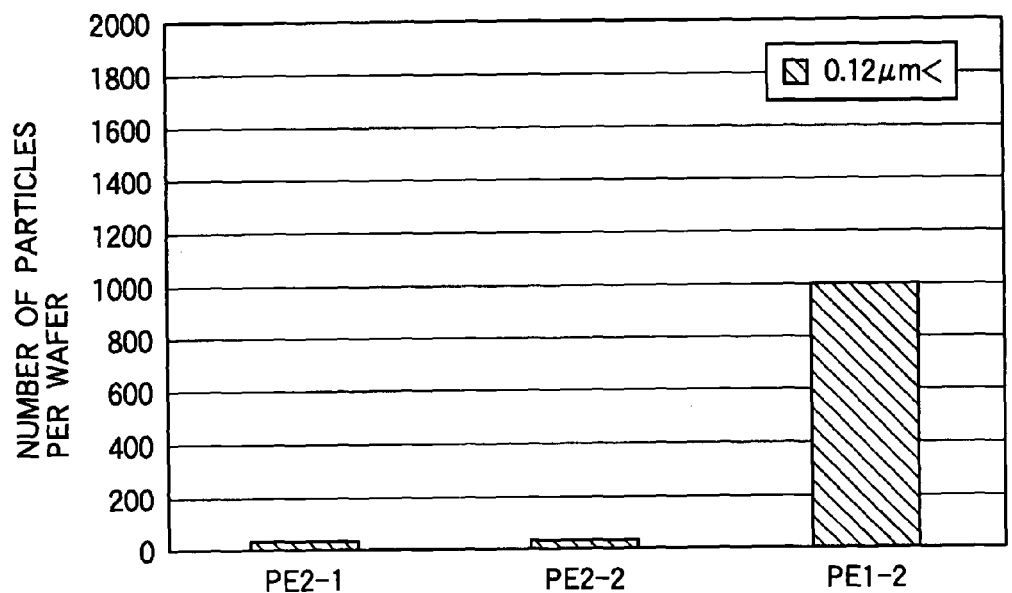
FIG. 6 is a characteristic diagram showing the relationship between the temperature increase rate and, the particle deposition on wafers.

FIG. 6 is a characteristic diagram showing the relationship between the temperature increase rate and the particle deposition on wafers, obtained by the experiment 2. FIG. 6 also shows the data of the present example PE1-2 described above, for comparison.

PRESENT EXAMPLE PE1-2

This example differed from the present example PE2-1 only in that the temperature increase rate was set at 25° C./minute.

As shown in FIG. 6, in the present examples PE2-1 and PE2-2 using a lower temperature increase rate than the present example PE1-2, the number of deposited particles was about 20/wafer, which was lower than that obtained by the present example PE1-2. This result is thought to have been caused by the following phenomenon. Specifically, in this case, since the temperature increase rate was set lower, the amount of out gas emission per unit of time was decreased, so the effects of the oxygen gas supply and out gas exhaust were enhanced.

Experiment 3

An experiment was conducted in terms of the relationship between the pressure decrease and cyclic purge subsequent to wafer loading and the particle deposition on wafers. In this experiment, 100 wafers W with a coating film formed thereon were loaded into the process field inside the reaction tube 3 pre-heated at 200° C. Then, oxygen gas was supplied into the process field maintained at this temperature while it was kept exhausted, and the wafers W were placed inside the reaction tube 3 having predetermined conditions for 15 minutes. The oxygen gas flow rate and the pressure of the process field were set at different values (used as a parameter). Some of the wafers W thus processed were sampled, and the number of particles deposited thereon and having a size of 0.12 µm or more was measured. An average value of particle deposition was calculated from the number of particles deposited on the sample wafers. In the experiment 3, three or four runs were performed under each set of conditions, and an average value of particle deposition obtained by the runs was calculated as an experimental result of each of the present examples and comparative example.

PRESENT EXAMPLE PE3-1

The oxygen gas flow rate was fixed at 10 slm, and the pressure inside the reaction tube 3 was fixed at 1.3 kPa (10 torr), (pressure decrease condition).

PRESENT EXAMPLE PE3-2

The oxygen gas flow rate was periodically swung within a range of 1 to 10 slm such that "1 slm→10 slm →1 slm→ ---", and the pressure inside the reaction tube 3 was periodically swung within a range of 0.1 to 1.3 kPa (1 to 10 torr) such that "0.1 kPa→1.3 kPa→0.1 kPa→ --- ", (pressure decrease+ cyclic purge condition).

Comparative Example CE3-1

The oxygen gas flow rate was fixed at 10 slm, and the pressure inside the reaction tube 3 was fixed at atmospheric pressure (101.3 kPa (760 torr)), (atmospheric pressure condition).

Figure 7:
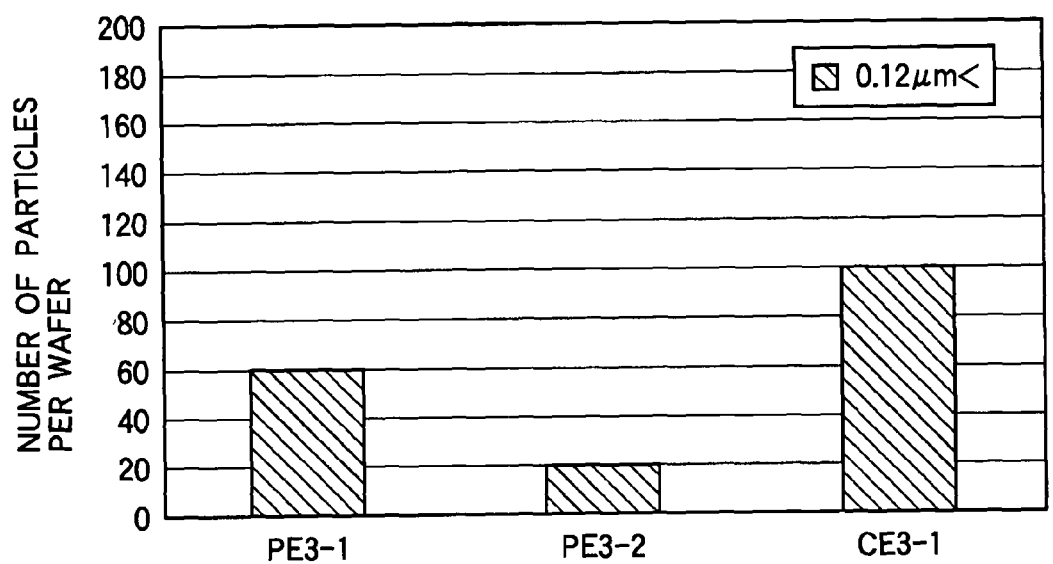
FIG. 7 is a characteristic diagram showing the relationship between the pressure decrease and cyclic purge subsequent to wafer loading and the particle deposition on wafers.

FIG. 7 is a characteristic diagram showing the relationship between the pressure decrease and cyclic purge subsequent to wafer loading and the particle deposition on wafers, obtained by the experiment 3. The bar graph of FIG. 7 shows the average number of particles deposited on the sample wafers W of the 100 wafers W processed in the reaction tube 3. Each of the bars shows the number of particles having a diameter of 0.12 µm or more.

As shown in FIG. 7, in the present example PE3-1, the number of deposited particles having a diameter of 0.12 μm or more was about 60/wafer. In the comparative example CE3-1, the number of deposited particles was larger than that of the present example PE3-1. The result of the comparative example CE1-1 is thought to have been caused by the effect of exhausting an out gas, which was emitted due to the rapid temperature change from room temperature to the pre-heating temperature (200° C.).

In the present example PE3-2, the number of deposited particles having a diameter of 0.12 μm or more was further decreased to about 20/wafer. This result is thought to have been caused by the cyclic purge that exhausted an out gas more efficiently.

According to the embodiment described above, a polysilazane coating film disposed on a target substrate is baked to form an insulating film containing silicon and oxygen. In this process, when the temperature inside the reaction tube is increased from a pre-heating temperature to a predetermined temperature in the course of heating to a heat process temperature, an oxygen gas atmosphere is formed at a low pressure. In this case, while generation of sublimated gas from the coating film is suppressed by oxygen, a generated out gas is exhausted. Consequently, it is possible to enhance the effect of suppressing particle generation due to an out gas, so that the process yield is prevented from being decreased even where a heat process is performed for a substrate having a larger diameter or a large number of substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for processing a polysilazane film, the method comprising:

loading a target substrate with a polysilazane coating film formed thereon into a process field inside a reaction container;

then, performing a pre-treatment for the coating film and the process field by supplying oxygen gas to the process field and exhausting gas from inside the process container to set the process field at a preliminary pressure of 0.1 to 1.3 kPa while setting the process field at a preliminary temperature of 100 to 200° C., the pre-treatment comprising an oxygen cyclic purge of periodically changing the preliminary pressure between a lower pressure and a higher pressure both within a range of 0.1 to 1.3 kPa and periodically changing the flow rate of the oxygen gas between a lower flow rate and a higher flow rate by adjusting a pressure regulator of an exhaust system connected to the process container and a flow rate controller of an oxygen gas supply system connected to the process container;

then, performing temperature increase of changing the process field from the pre-heating temperature to a predetermined temperature, of 200 to 500° C. at an average temperature increase rate of 1 to 10° C./minute, while supplying the oxygen gas to the process field and exhausting gas from inside the process container to set the process field at a transit pressure of 6.7 to 26.7 kPa; and then, performing a heat process for baking the coating film to obtain an insulating film containing silicon and oxygen by setting the process field at a process temperature not lower than the predetermined temperature, while supplying an oxidizing gas to the process field and exhausting gas from inside the process container to set the process field at a process pressure higher than the transit pressure.

2. The method according to claim 1, wherein the process pressure is set to be 101 kPa or less.

3. The method according to claim 1, wherein the oxidizing gas comprises water vapor gas.

4. The method according to claim 1, wherein, after the heat process, the method further comprises performing a first additional heat process at a first additional process temperature higher than the process temperature, and a second additional heat process at a second additional process temperature higher than the first additional process temperature, in this order, to bake the coating film of the process field from the heat process to the second additional heat process.

5. The method according to claim 4, wherein the first additional heat process is arranged to set the process field to be an atmosphere formed of the oxidizing gas.

6. The method according to claim 5, wherein the second additional heat process is arranged to set the process field to be an inactive gas atmosphere.

7. The method according to claim 1, wherein the oxygen cyclic purge is performed for 5 to 30 minutes.

8. The method according to claim 1, wherein the oxidizing gas comprises water vapor generated by a reaction of the oxygen gas with hydrogen gas outside the process container.

9. The method according to claim 5, wherein the first additional heat process is performed at substantially the same pressure as the process pressure of the heat process.

10. The method according to claim 6, wherein the first and second additional heat processes are performed at substantially the same pressure as the process pressure of the heat process.

* * * * *